United States Patent [19]

Kokura

[11] Patent Number: 5,400,021
[45] Date of Patent: Mar. 21, 1995

[54] APPARATUS FOR CONTROLLING AN OPERATIONAL PANEL

[75] Inventor: Masuo Kokura, Hino, Japan
[73] Assignee: Fanuc Ltd., Yamanashi, Japan
[21] Appl. No.: 952,616
[22] PCT Filed: Mar. 26, 1992
[86] PCT No.: PCT/JP92/00369
§ 371 Date: Nov. 23, 1992
§ 102(e) Date: Nov. 23, 1992
[87] PCT Pub. No.: WO92/17833
PCT Pub. Date: Oct. 15, 1992

[30] Foreign Application Priority Data

Mar. 26, 1991 [JP] Japan ............................. 3-086308

[51] Int. Cl.⁶ ......................................... H03M 11/00
[52] U.S. Cl. ........................................ 341/27; 341/22;
340/384.5; 364/709.12
[58] Field of Search ............... 341/27, 22; 340/328,
340/329, 384.5; 364/709.12; 200/5 A, 308

[56] References Cited

U.S. PATENT DOCUMENTS

| | | | |
|---|---|---|---|
| 4,249,245 | 3/1981 | Nakanishi et al. | 341/27 |
| 4,728,936 | 3/1988 | Guscott et al. | 341/27 |
| 5,070,330 | 12/1971 | Wu | 341/27 |

FOREIGN PATENT DOCUMENTS 53-94125 8/1978 Japan .
59-220825 12/1984 Japan .

Primary Examiner—James J. Groody
Assistant Examiner—Glenton B. Burgess
Attorney, Agent, or Firm—Nikaido, Marmelstein Murray & Oram

[57] ABSTRACT

An apparatus for controlling an operational panel on which keyboards or change over switches are randomly arranged. Wherein the electrical circuit constitution is simple and each switch can be freely selected corresponding to whether a buzzer should be sounded or not when operating the switches. The constitution of the apparatus for controlling an operational panel includes a switch matrix (21) including n number of rows of data lines (231-23n), and m number of columns of common lines (241-24m). These data lines (231-23N) and common lines (241-24m) intersect each other. At each intersection, switches (S11-Snm) are respectively provided. Data lines (231-23n) and the common lines are connected to the receiving circuit (8), and a driving circuit (9). Switch discriminating elements (251-25m) are connected to the receiving circuit (8) via switch discriminating data lines (26) on each of the common lines (241-24m).

4 Claims, 5 Drawing Sheets

APPARATUS FOR CONTROLLING AN OPERATIONAL PANEL

TECHNICAL FIELD

The present invention relates to an apparatus for controlling an operational panel on which keyboards or change over switches are arranged, and relates more particularly to an apparatus for controlling an operational panel that has a signaling function that indicates switching operations by a buzzer.

BACKGROUND ART

Recently, an apparatus for controlling an operational panel on which keyboards, rotary switches or other switches are arranged, is utilized for machine tools, etc., and has a signaling function using a buzzer when switching so as to provide an operator with audible feedback. This function is quite useful when operating switches having very little tactile feedback such as flat key switches. However, it can be irritating when operating switches that clearly provide sufficient tactile feedback, such as rotary switches, change over switches, etc. Therefore, in the prior art, it is previously determined whether the buzzer should be sounded for each switch or not.

In general, a matrix circuit is used for discriminating the ON/OFF state of each switch on an operational panel. The matrix circuit is arranged such that a switch is provided for each intersection of the matrix, and the ON/OFF state of each switch is discriminated by driving signals sent through each of the common lines.

The discrimination of whether the buzzer should be sounded or not when a switch is the ON state, is accomplished by providing 2 groups of common lines. Namely, intersections of the matrix for sounding the buzzer are located in a group No. 1 of common lines, while intersections of the matrix for not sounding the buzzer are located in a group No. 2 of common lines.

Thereby the apparatus for controlling an operational panel is controlled so as to sound the buzzer if any of the intersections are in the ON state when the No. 1 group of common lines is driven, and the apparatus is controlled so as not to sound the buzzer if any of the intersections are in the ON state when the No. 2 group of common lines is driven.

However in the prior art, there is a problem that the operational panel cannot be freely manufactured because the number of switches that sound the buzzer and the number of switches that do not sound the buzzer, have to be determined during the switch layout design stage of the operational panel.

DISCLOSURE OF THE INVENTION

Accordingly, it is an object of the present invention to provide an apparatus for controlling an operational panel comprised of a simple electric circuit, in the light of the above mentioned problem. A further object of the present invention is to provide an operational panel in which the switch layout on the operational panel, can be more freely determined.

According to the present invention, to solve the above described problems, an apparatus for controlling an operational panel on which keyboards or change over switches are arranged, is characterized in that it comprises, switches arranged at each intersection of a switch matrix, a driving circuit for transferring drive signals to common lines of the switch matrix, a receiving circuit for receiving switch input signals via data lines of the switch matrix, switch discriminating elements for transferring switch discriminating signals to the receiving circuit via switch discriminating data lines, the signals indicating whether the switches should sound a buzzer or not when receiving the driving signals arranged on each of the common lines, an ON/OFF state discriminating means for discriminating the ON/OFF state of the switches after reading the states of the driving signals and the switch input signals, a buzzer driving discriminating means for discriminating whether the buzzer should be sounded or not by reading the switch discriminating signals via the switch discriminating elements when any of the switches are determined to be in an ON state by the ON/OFF state discriminating means, a buzzer driving means for sounding the buzzer when the buzzer driving discriminating means determines that the buzzer should be sounded.

Each of the switch discriminating signal for discriminating whether to sound the buzzer or not, and which come from switch discriminating elements connected to the common lines transferring the driving signal from the driving circuit, is sent to the receiving circuit via switch discriminating data lines.

If the ON/OFF state discriminating means determines that any of switches are in the ON state, then the buzzer driving discriminating means determines whether to sound the buzzer or not by reading the switch discriminating signal from the switch discriminating element, and the buzzer driving discriminating means drives the buzzer to be sounded when it determines to sound the buzzer.

Therefore it is not necessary to provide the driving circuit for discriminating whether to sound the buzzer or not, and as a result the electrical circuit becomes simplified.

Furthermore, switches can be more freely selected because the number of combinations of switches for which the buzzer is to be sounded or not, can be determined when manufacturing the operational panel.

BEST MODE FOR CARRYING OUT THE INVENTION

An embodiment of the present invention will be explained hereinafter, referring to the attached drawings.

Figure 1:
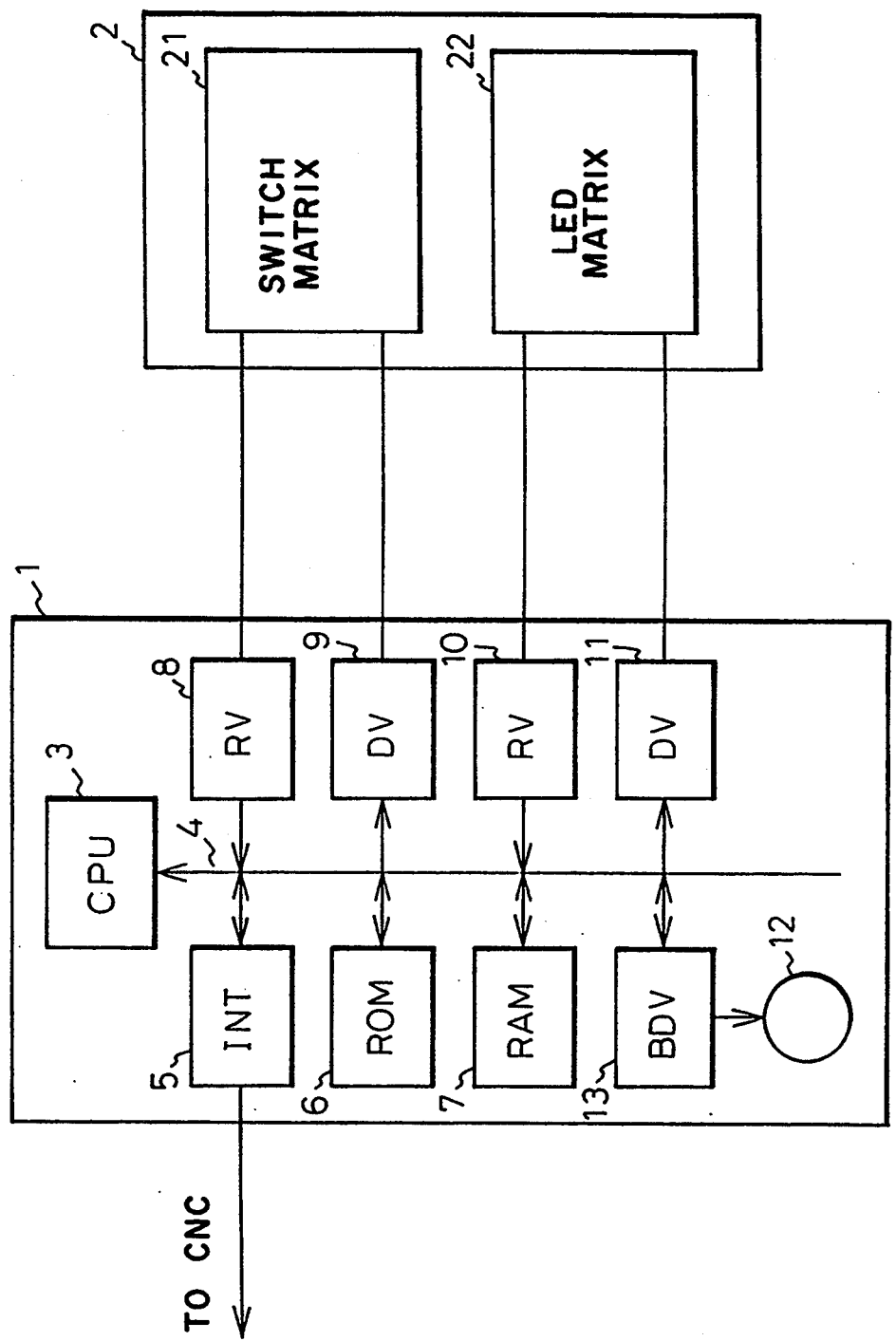
FIG. 1 is a block diagram showing a structure of an apparatus for controlling an operational panel of an embodiment of the present invention.

FIG. 1 is a block diagram showing a structure of an apparatus for controlling an operational panel in an embodiment of the present invention. The apparatus for controlling an operational panel can be applied to a machine tool controlled by a computerized numerical controller (CNC). The apparatus for controlling an operational panel constitutes a main control unit 1 and an operational panel 2. The main control unit 1 mainly consists of a processor 3. The processor 3 is connected to an interface (INT) 5, a ROM 6 and a RAM 7 via a bus 4. The INT 5 receives signals from the CNC or outputs signals to the CNC. The ROM 6 is a memory for storing a system program for controlling signals that are transferred through a switch matrix 21 and a LED matrix 22 in the operational panel 2. The RAM 7 is a memory for temporarily storing data during the system program execution.

The main control unit 1 is electrically connected to the operational panel 2. The switch matrix 21 and the LED matrix 22 are provided in the operational panel 2. The switch matrix 21 is connected to a receiving circuit (RV) 8 and a driving circuit (DV) 9 in the control unit 1. On the other hand, the LED matrix 22 is connected to a receiving circuit (RV) 10 and a driving circuit (DV) 11 in the main control unit 1. In the FIG. 1, lines connected between the main control unit 1 and the operational panel 2 are simply shown only as single lines, but a number of lines corresponding to the actual number of each matrix points are connected therebetween.

A buzzer 12 is connected to the bus 4 via the buzzer driving circuit 13. The buzzer 12 sounds at the time when a command signal is supplied by the processor 3 by means of a system hereinafter explained. Next, the structure of the switch matrix 21 will be explained.

Figure 2:
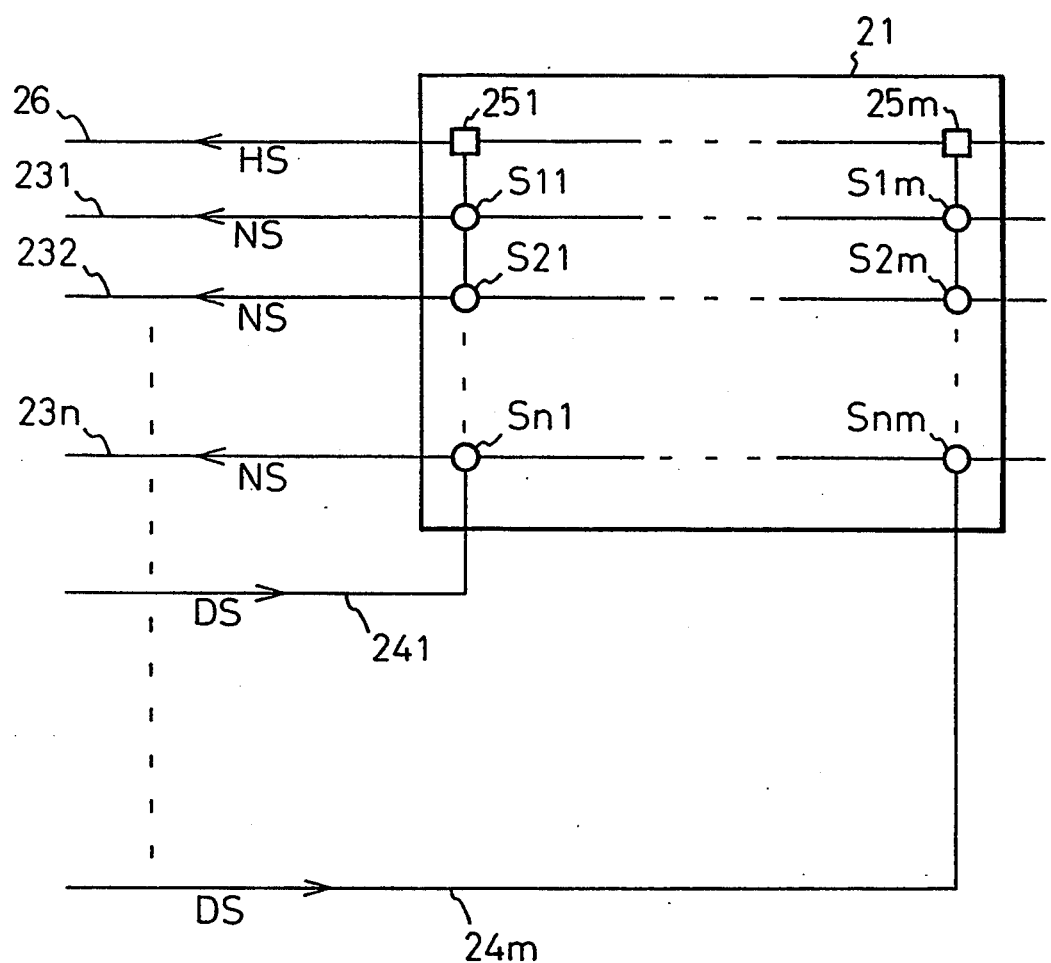
FIG. 2 is a circuit drawing showing a brief structure of a switch matrix circuit.

FIG. 2 is a circuit drawing briefly showing the structure of a switch matrix circuit. The switch matrix 21 includes n rows of data lines 231-23$n$, m columns of common lines 241-24$m$, each of the data lines 231-23$n$ intersecting each of the common lines 241-24$m$, and switches S11 to Snm provided at each of the respective intersections. The data lines 231-23$n$ are connected to the receiving circuit 8 and the common lines 241-24$m$ are connected to the driving circuit 9.

Figure 3:
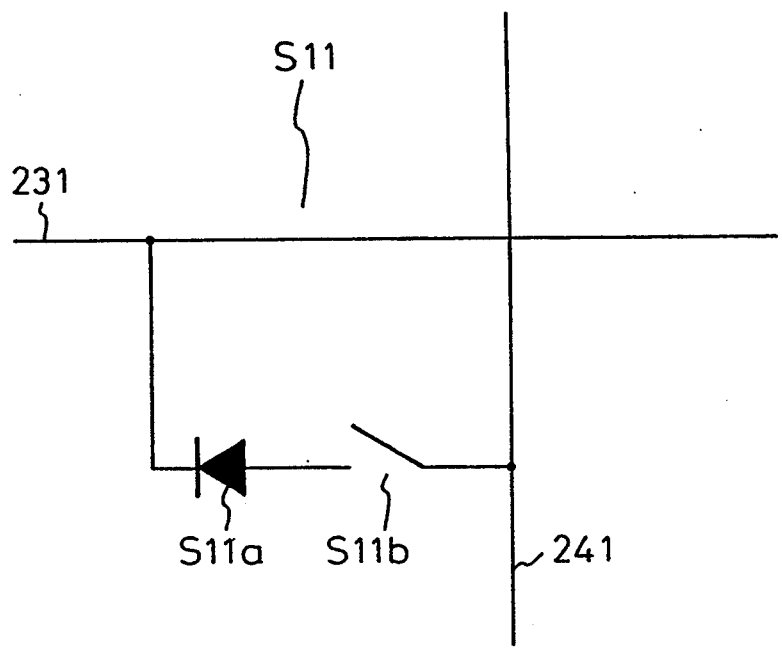
FIG. 3 is a drawing showing a structure of a switch.

FIG. 3 is a drawing showing the structure of a switch S11. The switch S11 constitutes a diode S11$a$ for blocking reverse current, and an intersection switch S11$b$ directly coupled to a flat key switch, a rotary switch or other type of switch on the operational panel which are not shown in the drawing. When the intersection switch S11$b$ is closed while the driving signal DS is transferred to the common line 241 from the driving circuit 9, the driving signal DS is being transferred to the data line 231 via the diode S11$a$. This driving signal DS is transferred to the receiving circuit 8 as a high level switch input signal NS.

The switches from S12 to Snm have the same constitution as the switch S11, so the explanation is omitted.

Referring back to FIG. 2, switch discriminating elements 251-25$m$ are provided in the common lines 241-24$m$. The switch discriminating elements 251-25$m$ are connected to a switch discriminating data line 26 which is connected to the receiving circuit 8. From the switch discriminating elements 251-25$m$, the switch discriminating signals HS which indicate whether switches arranged on each of the common lines are to sound the buzzer 12 or not, are output. The switch discriminating signals HS are high level when the buzzer 12 should be sounded, and low level when the buzzer 12 should not be sounded.

Figure 6:
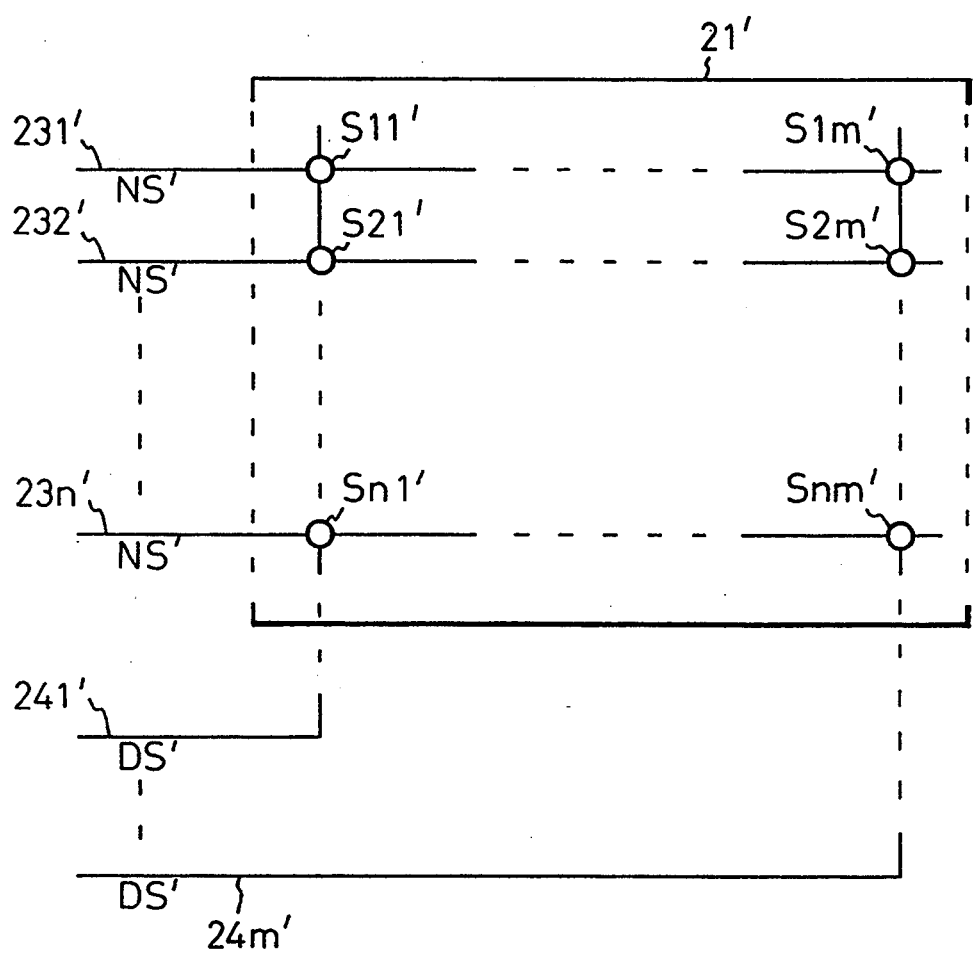

FIG. 6 is a circuit drawing showing a brief structure of a switch matrix circuit 21' according to a prior art.

The points that are different from FIG. 2 are that there are no switch discriminating elements 251-25$m$, so that the switch discriminating signals HS are not output to the main control unit 1. Therefore the operations such as dividing the common lines into 2 groups, providing driving circuits corresponding to each of the common lines, and assigning 2 groups, for example, one group for sounding the buzzer, the other group for not sounding the buzzer, are necessary.

In the present embodiment, among the switch discriminating elements 251-25$m$ shown in FIG. 2, the switch discriminating element 251 is predetermined as an output element of a high level signal, while the switch discriminating element 25$m$ is predetermined as an output element of a low level signal. Namely the switches S11 to Sn1 on the same common line 241 as the common line of the switch discriminating element 251 are assigned as flat key switches having less tactile or audible feedback and requiring sounding by the buzzer 12. On the other hand, the switches S1$m$ to Snm on the same common line 24$m$ as the common line of the switch discriminating element 25$m$ are assigned as rotary switches or change over switches having adequate tactile or audible feedback and not requiring sounding by the buzzer 12.

Figure 4:
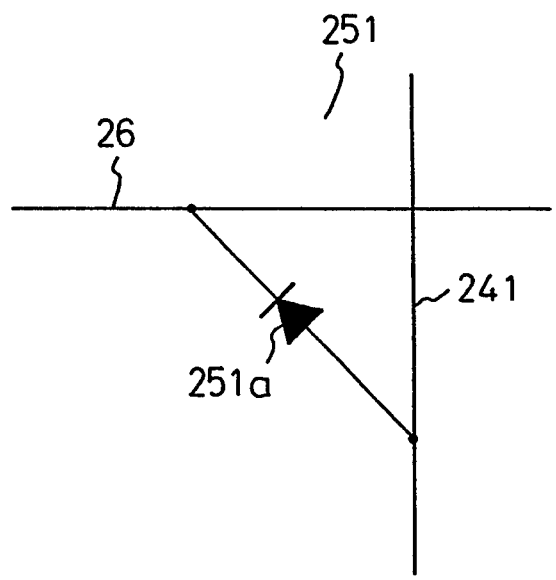
FIG. 4 is a drawing showing an example of a structure of a switch discriminating element, and a circuit to output switch discriminating signals at high levels.

FIG. 4 is a drawing showing an example of a structure of a switch discriminating element 251, and a circuit for outputting the switch discriminating signals HS as a high level signal to the receiving circuit 8. As shown in FIG. 4, the common line 241 is connected to the switch discriminating data line 26 via the diode 251$a$. Accordingly when a driving signal DS is sent to the common line 241, the driving signal DS is also sent to the switch discriminating line 26 via the diode 251$a$, and to the receiving circuit 8 as a high level switch discriminating signal HS.

Figure 5:
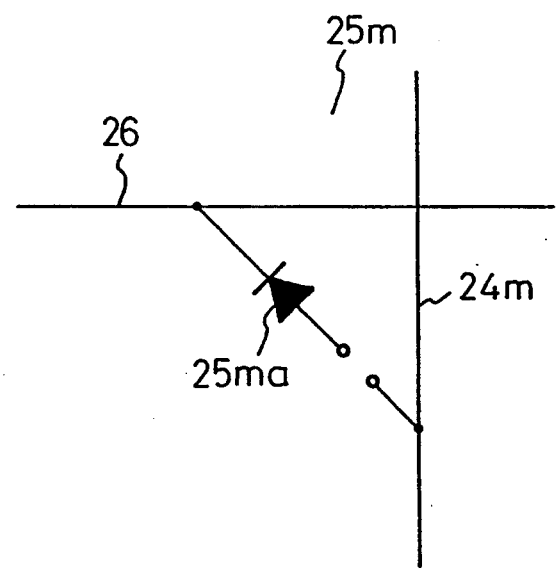
FIG. 5 is an another drawing showing an example of a structure of a switch discriminating element, and a circuit for outputting switch discriminating signals at low levels; and, FIG. 6 is a circuit drawing showing a brief structure of a switch matrix circuit according to the prior art.

FIG. 5 is a drawing showing another example of a structure of a switch discriminating element 25$m$, and a circuit for outputting the switch discriminating signal HS as a low level signal to the receiving circuit 8. In this case, the anode terminal of the diode 25$ma$ is open as shown in FIG. 5. The anode terminals can be left open when manufacturing the operational panel 2, or there could simply be nothing provided between the common line 24$m$ and the switch discriminating data line 26. In this way, the switch discriminating signal HS is transferred to the receiving circuit 8 as a low level signal.

Again referring to FIG. 2, if the driving signal DS is transferred to the common line 241, the switch discriminating element 251 transfers the high level switch discriminating signal HS to the receiving circuit 8. In this case, if any of the switches S11-Sn1 are on, a high level switch input signal NS is transferred to the receiving circuit 8. The receiving circuit 8 transfers the signals of the switch discriminating signal HS and the switch input signal NS to the processor 3. The processor 3 determines whether the buzzer 12 should be sounded after reading the states of the switch discriminating signal HS, the switch input signal NS and the driving signal DS. The processor 3 then transfers the command signal to sound the buzzer 12 to the driving circuit 13, and the buzzer driving circuit 13 sounds by the buzzer 12.

On the other hand, if the driving signal DS is transferred to the common line 24$m$, the switch discriminating element 25$m$ transfers the low level switch discriminating signal HS to the receiving circuit 8. In this case, even if any of the switches S1$m$-Snm are on, the processor 3 judges that it is not necessary to sound the buzzer 12, so the command signal to sound the buzzer 12 is not transferred to the buzzer driving circuit 13.

In this way, by providing the switch discriminating elements 251-25m on the common lines 241-24m, it is possible to preset the buzzer 12 to sound or not corresponding to the group of switches on each of the common lines.

Accordingly, the constitution of the circuit of the main control unit 1 is simplified.

Since it is possible to preset the number of combinations of the switches that sound or not when manufacturing the operational panel 2, switch arrangement on the operational panel can be more freely carried out.

As heretofore explained, according to the present invention, the constitution of the circuit becomes simple because the apparatus for controlling an operational panel is constituted such that switch discriminating elements are provided on the common lines, and because the driving circuit is no longer required for discriminating whether to sound the buzzer or not.

Since it is possible to preset the number of combinations of switches that sound or not when manufacturing the operational panel corresponding to the group of switches on each of the common lines, the switch arrangement on the operational panel can be more freely carried out.

I claim:

1. An apparatus for controlling an operational panel on which keyboards or change over switches are arranged, comprising:

first common lines and second common lines;
   data lines;
   switches arranged at each intersection of said first common lines and said data lines and said second common lines and said data lines of a switch matrix, switches for sounding a buzzer arranged on said first common lines and switches for not sounding said buzzer arranged on said second common lines;
   a driving circuit for transferring driving signals to said first common lines and said second common lines of the switch matrix;
   a receiving circuit for receiving switch input signals via said data lines of said switch matrix;
   switch discriminating elements, arranged at intersections of said first common lines and switch discriminating data lines, and at said second common lines and said switch discriminating data lines for transferring switch discriminating signals to said receiving circuit via said switch discriminating data lines, said switch discriminating signals indicating whether said switches should sound said buzzer when receiving said driving signals arranged on each of said first common lines and said second common lines;
   an ON/OFF state discriminating means for discriminating the ON/OFF state of said switches after reading the states of said driving signals and said switch input signals;
   a buzzer driving discriminating means for discriminating whether said buzzer should be sounded by reading said switch discriminating signals via said switch discriminating elements when any of said switches are determined to be in an ON state by said ON/OFF state discriminating means; and
   a buzzer driving means for sounding said buzzer when said buzzer driving discriminating means determines that said buzzer should be sounded.

2. An apparatus for controlling an operational panel as claimed in claim 1, characterized in that buzzer sounds when said switches arranged at each intersection of said switch matrix are flat key type switches, and does not sound said buzzer (12) when they are rotary switches or change over switches.

3. An apparatus for controlling an operational panel on which keyboards or change over switches are arranged, comprising:

switches arranged at each intersection of a switch matrix;
   a driving circuit for transferring driving signals to common lines of the switch matrix;
   a receiving circuit for receiving switch input signals via said data lines of said switch matrix;
   switch discriminating elements for transferring switch discriminating signals to said receiving circuit via switch discriminating data lines, said switch discriminating signals indicating whether said switches should sound a buzzer when receiving said driving signals arranged on each of said common lines;
   an ON/OFF state discriminating means for discriminating the ON/OFF state of said switches after reading the states of said driving signals and said switch input signals;
   a buzzer driving discriminating means for discriminating whether said buzzer should be sounded by reading said switch discriminating signals via said switch discriminating elements when any of said switches are determined to be in an ON state by said ON/OFF state discriminating means; and
   a buzzer driving means for sounding said buzzer when said buzzer driving discriminating means determines that said buzzer should be sounded,
   wherein said buzzer sounds when said switches arranged at each intersection of said switch matrix are flat key type switches, and does not sound said buzzer when they are rotary switches or change over switches and wherein said switch discriminating elements comprise diodes when said switch discriminating elements are arranged on said common lines where switches for sounding said buzzer are arranged, while said common lines and said switch discriminating data line are cut off when said switch discriminating elements are arranged on said common lines where switches for not sounding said buzzer are arranged.

4. An apparatus for controlling an operational panel as claimed in claim 2, characterized in that said switches (S11a-Snma) comprise diodes (S11a-Snma) for blocking reverse current and contact switches for switching.

* * * * *